(12) United States Patent
Chiu

(10) Patent No.: US 10,459,837 B2
(45) Date of Patent: Oct. 29, 2019

(54) DATA STORAGE DEVICE WITH PRODUCTION STATE AWARENESS AND NON-VOLATILE MEMORY OPERATING METHOD WITH PRODUCTION STATE AWARENESS

(71) Applicant: Silicon Motion, Inc., Jhubei, Hsinchu County (TW)

(72) Inventor: Shen-Ting Chiu, Houlong Township, Miaoli County (TW)

(73) Assignee: SILICON MOTION, INC., Jhubei, Hsinchu County (TW)

( * ) Notice: Subject to any disclaimer, the term of this patent is extended or adjusted under 35 U.S.C. 154(b) by 27 days.

(21) Appl. No.: 15/853,429

(22) Filed: Dec. 22, 2017

(65) Prior Publication Data

US 2018/0322041 A1    Nov. 8, 2018

(30) Foreign Application Priority Data

May 2, 2017    (TW) .............................. 106114455 A

(51) Int. Cl.
*G06F 12/02*    (2006.01)
*G06F 11/07*    (2006.01)
(Continued)

(52) U.S. Cl.
CPC ........ *G06F 12/0246* (2013.01); *G06F 9/3004* (2013.01); *G06F 11/073* (2013.01);
(Continued)

(58) Field of Classification Search
CPC ......... H04L 63/10; H04L 63/20; H04L 51/04; H04L 63/101; H04L 67/306; H04L 67/02;
(Continued)

(56) References Cited

U.S. PATENT DOCUMENTS

2010/0122016 A1\* 5/2010 Marotta .............. G06F 12/0246
711/103
2010/0169547 A1\* 7/2010 Ou ...................... G06F 12/0246
711/103
(Continued)

FOREIGN PATENT DOCUMENTS

| CN | 101923512 A | 12/2010 |
| TW | I420313 B | 12/2013 |
| TW | 201715399 A | 5/2017 |

*Primary Examiner* — Hong C Kim
(74) *Attorney, Agent, or Firm* — McClure, Qualey & Rodack, LLP

(57) ABSTRACT

A data-downloading technique for a data storage device before soldering the data storage device into a product. The data storage device uses a flash memory to provide first-type blocks (using single level cells) and second-type blocks (using multi-level cells). Before soldering the data storage device onto a printed circuit board, a controller of the data storage device allocates the first-type blocks to store data from a host. When the allocated number of first-type blocks reaches an upper limit, the controller changes to allocate the second-type blocks to store data from the host. When detecting that the controller has changed to allocate the flash memory to provide the second-type blocks to receive data from the host, the controller returns a fail message to the host to indicate unreliable write operations prior to soldering.

20 Claims, 6 Drawing Sheets

(51) Int. Cl.
*G06F 9/30* (2018.01)
*G11C 29/52* (2006.01)
(52) U.S. Cl.
CPC ...... *G11C 29/52* (2013.01); *G06F 2212/2022* (2013.01); *G06F 2212/7201* (2013.01)
(58) Field of Classification Search
CPC ... H04L 51/22; G06F 16/9535; G06F 16/183; G06F 16/182; G06F 16/93; G06F 16/16; G06F 16/13; G06F 16/178; G06F 16/1873; G06F 16/192; G06F 21/62; G06F 12/0246; G06F 11/073; G06F 9/3004; G06F 2212/7201; G06F 2212/2022; G11C 29/52
USPC ..... 365/185.03, 185.09, 201, 148, 158, 162, 365/185.01; 711/106, 103, 165, 154
See application file for complete search history.

(56) References Cited

U.S. PATENT DOCUMENTS

| | | | |
|---|---|---|---|
| 2011/0271043 A1* | 11/2011 | Segal | G06F 12/0246 711/103 |
| 2012/0191903 A1* | 7/2012 | Araki | G06F 12/0246 711/103 |
| 2015/0120988 A1 | 4/2015 | Hung et al. | |
| 2016/0155496 A1* | 6/2016 | Rao | G11C 16/3495 365/185.03 |
| 2016/0217067 A1* | 7/2016 | Chiu | G06F 12/0246 |
| 2017/0115933 A1* | 4/2017 | Lin | G06F 12/0246 |

* cited by examiner

DATA STORAGE DEVICE WITH PRODUCTION STATE AWARENESS AND NON-VOLATILE MEMORY OPERATING METHOD WITH PRODUCTION STATE AWARENESS

CROSS REFERENCE TO RELATED APPLICATIONS

This Application claims priority of Taiwan Patent Application No. 106114455, filed on May 2, 2017, the entirety of which is incorporated by reference herein.

BACKGROUND OF THE INVENTION

Field of the Invention

The present invention relates to data storage devices using flash memories as the storage medium.

Description of the Related Art

Flash memories are often used as the storage medium in data storage devices used in today's portable electronic devices, such as a smartphone, a tablet PC, and so on. The flash memory and its controller may be made in a package. The package has to be soldered to a printed circuit board of a portable electronic device. The high temperature of soldering may result in damage to the contents stored in the flash memory. Problems caused by soldering should be considered in this field of technology.

BRIEF SUMMARY OF THE INVENTION

A data storage device in accordance with an exemplary embodiment of the disclosure includes a flash memory and a controller. The flash memory provides a plurality of first-type blocks and a plurality of second-type blocks. The first-type blocks comprise single level cells (SLCs) and the second-type blocks comprise multi-level cells (MLCs or TLCs). The controller allocates the flash memory to provide the first-type blocks to receive data downloaded from a host before the data storage device is soldered to a printed circuit board. When the number of first-type blocks allocated to receive the data downloaded from the host exceeds an upper limit, the controller changes to allocate the flash memory to provide the second-type blocks to receive the data downloaded from the host. When detecting that the controller has changed to allocate the flash memory to provide the second-type blocks to receive the data downloaded from the host, the controller returns a fail message to the host to indicate unreliable write operations prior to soldering.

In another exemplary embodiment, a method for operating a data storage device is disclosed, which comprises: allocating a flash memory of a data storage device to provide space to receive data downloaded from a host, wherein the flash memory provides a plurality of first-type blocks and a plurality of second-type blocks, the first-type blocks comprise single level cells, and the second-type blocks comprise multi-level cells; and allocating the flash memory to provide the first-type blocks to receive the data downloaded from the host before the data storage device is soldered to a printed circuit board. Note that when the number of first-type blocks allocated to receive the data downloaded from the host exceeds an upper limit, the flash memory is changed to provide the second-type blocks to receive the data downloaded from the host. When detecting that the flash memory has been changed to provide the second-type blocks to receive the data downloaded from the host, a fail message is returned to the host to indicate unreliable write operations prior to soldering.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description shows exemplary embodiments of carrying out the invention. This description is made for the purpose of illustrating the general principles of the invention and should not be taken in a limiting sense. The scope of the invention is best determined by reference to the appended claims.

Figure 1A:
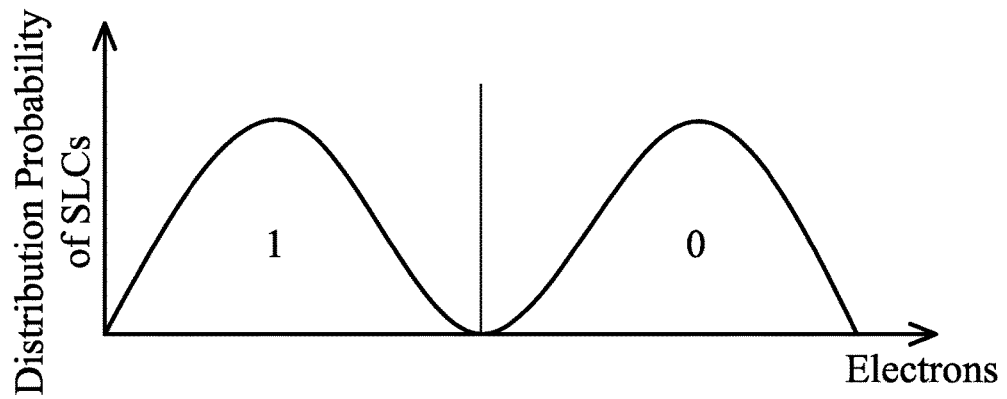
FIG. 1A illustrates the distribution probability of storage cells for SLC, MLC and TLC techniques, respectively, with the logical meanings changed by modifying the floating gate electrons.
Figure 1B:
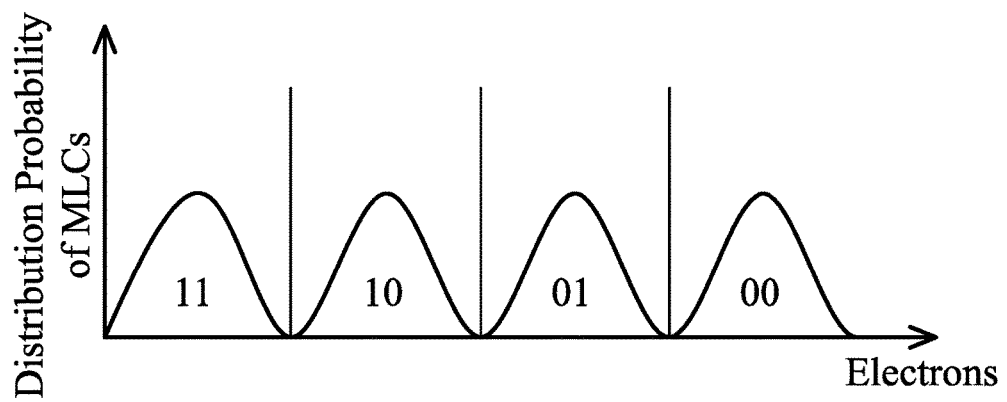
FIG. 1B illustrates the distribution probability of storage cells for SLC, MLC and TLC techniques, respectively, with the logical meanings changed by modifying the floating gate electrons.
Figure 1C:
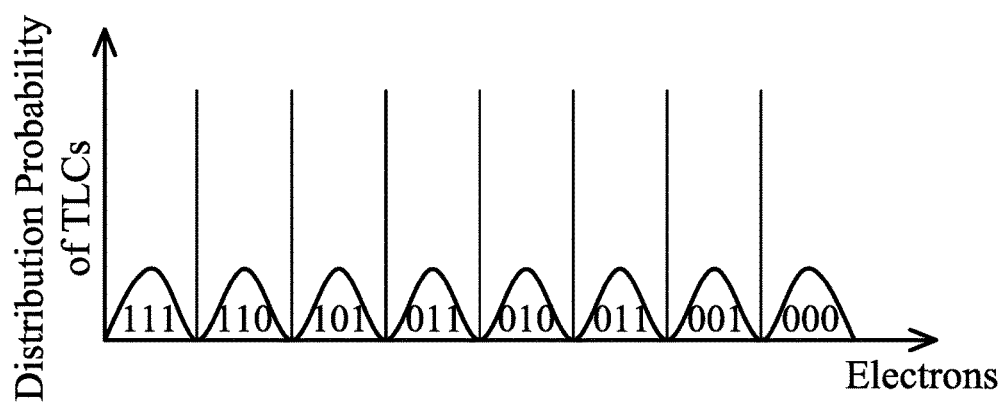
FIG. 1C illustrates the distribution probability of storage cells for SLC, MLC and TLC techniques, respectively, with the logical meanings changed by modifying the floating gate electrons.

Various storage cells may be used in a flash memory. A single level cell (SLC) stores one single bit. A multiple level cell (MLC) stores two bits. A triple level cell (TLC) stores three bits. FIGS. 1A, 1B and 1C illustrate the distribution probability of storage cells for SLC, MLC and TLC techniques, respectively, with the logical meanings changed by modifying the floating gate electrons. As shown, the logical definition of a memory cell is determined according to the gate floating electrons of the memory cell. The logical boundary of single level cells (SLCs) is clear in comparison with the logical boundaries of the multiple level cells (MLCs) or triple level cells (TLCs). Single level cells (SLCs) are more reliable. In the disclosure, before soldering, the flash memory stores data by single level cells (SLCs) to bear the high temperature of soldering.

Figure 2:
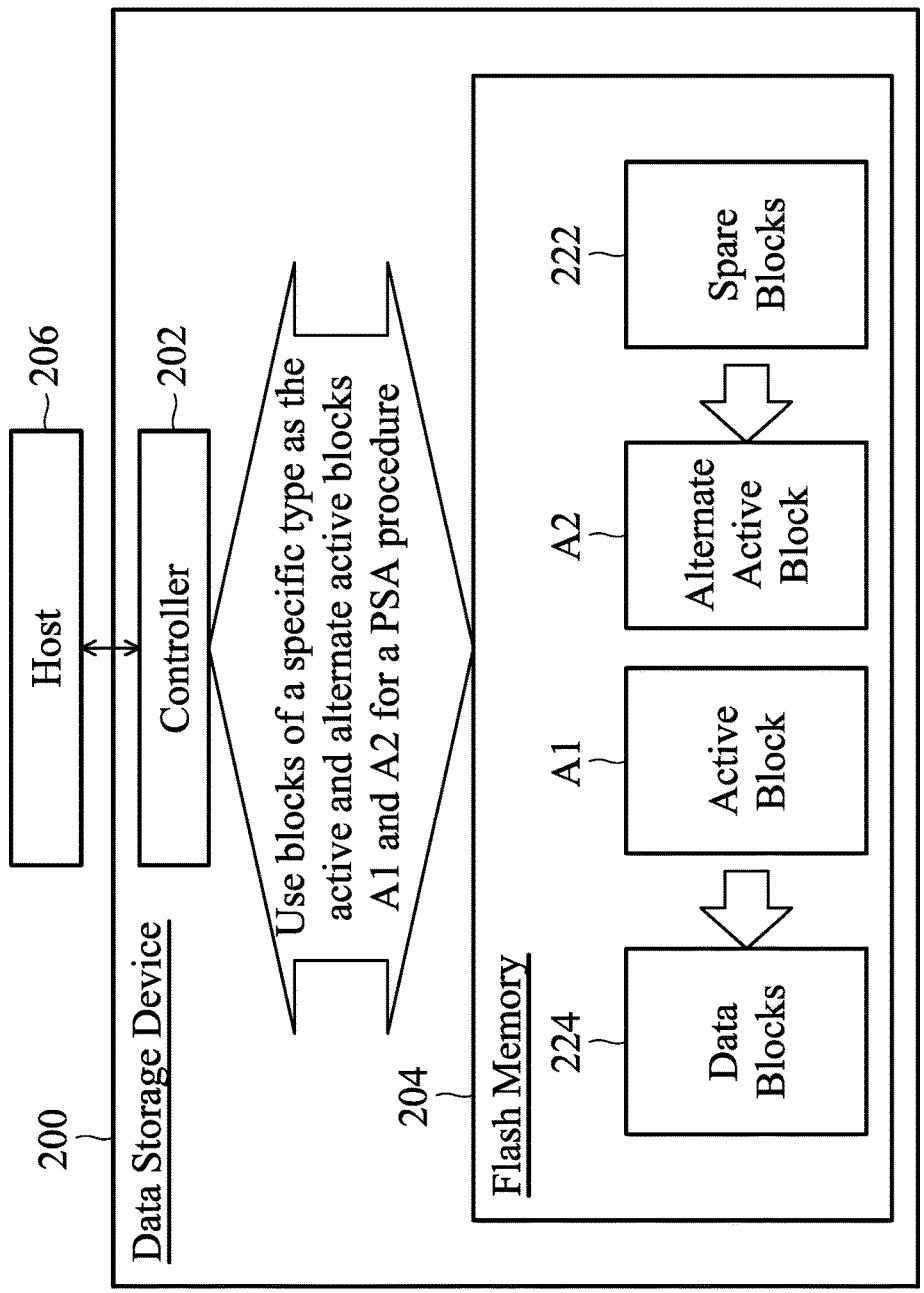
FIG. 2 depicts a data storage device 200 in accordance with an exemplary embodiment of the disclosure.

FIG. 2 depicts a data storage device 200 in accordance with an exemplary embodiment of the disclosure, which includes a controller 202 and a flash memory 204. The controller 202 and the flash memory 204 may be packaged together. Through the controller 202, a host 206 (a computer connected to a test board or a microprocessor of a commercialized portable electronic device) is able to access the flash memory 204. The data storage device 200 must be loaded with the basic data/code by a card opening procedure before being soldered to a printed circuit board of a portable electronic device to form a product. In order to protect the data in the flash memory 204 from being damaged by the high temperature of soldering, a production state awareness (PSA) procedure is introduced in the disclosure by which data is written to the reliable single level cells (SLCs) before the soldering.

The storage space of the flash memory 204 may be divided into a plurality of blocks. Each block can be divided into pages. The controller 202 allocates a pool 222 of spare blocks to provide an active block A1 and an alternate active block A2 to receive the write data issued by the host 206. When the active block A1 is finished (no matter being filled full or not), the active block A1 is pushed into the pool 224 of data blocks. Before being regarded as a data block, information (e.g. mapping tables) about the active block A1 has to be backed up in the flash memory 204 (e.g. backed up in system information blocks which are not shown in the figure). Before the backing up of the information regarding the active block A1 is done, the controller 202 uses the alternate active block A2 to store the write data to avoid loss of data. When backing up the information regarding the active block A1 and pushing the active block A1 into the pool 224 of data blocks are finished, the alternate active block A2 is regarded as the new active block and the controller 202 allocates the pool 222 of spare blocks to provide a spare block as the new alternate active block. In the disclosure, SLC blocks are allocated to be the active block A1 and the alternate active block A2 during the production state awareness (PSA) procedure to store data in such a way as to endure the high temperature of soldering.

Figure 3:
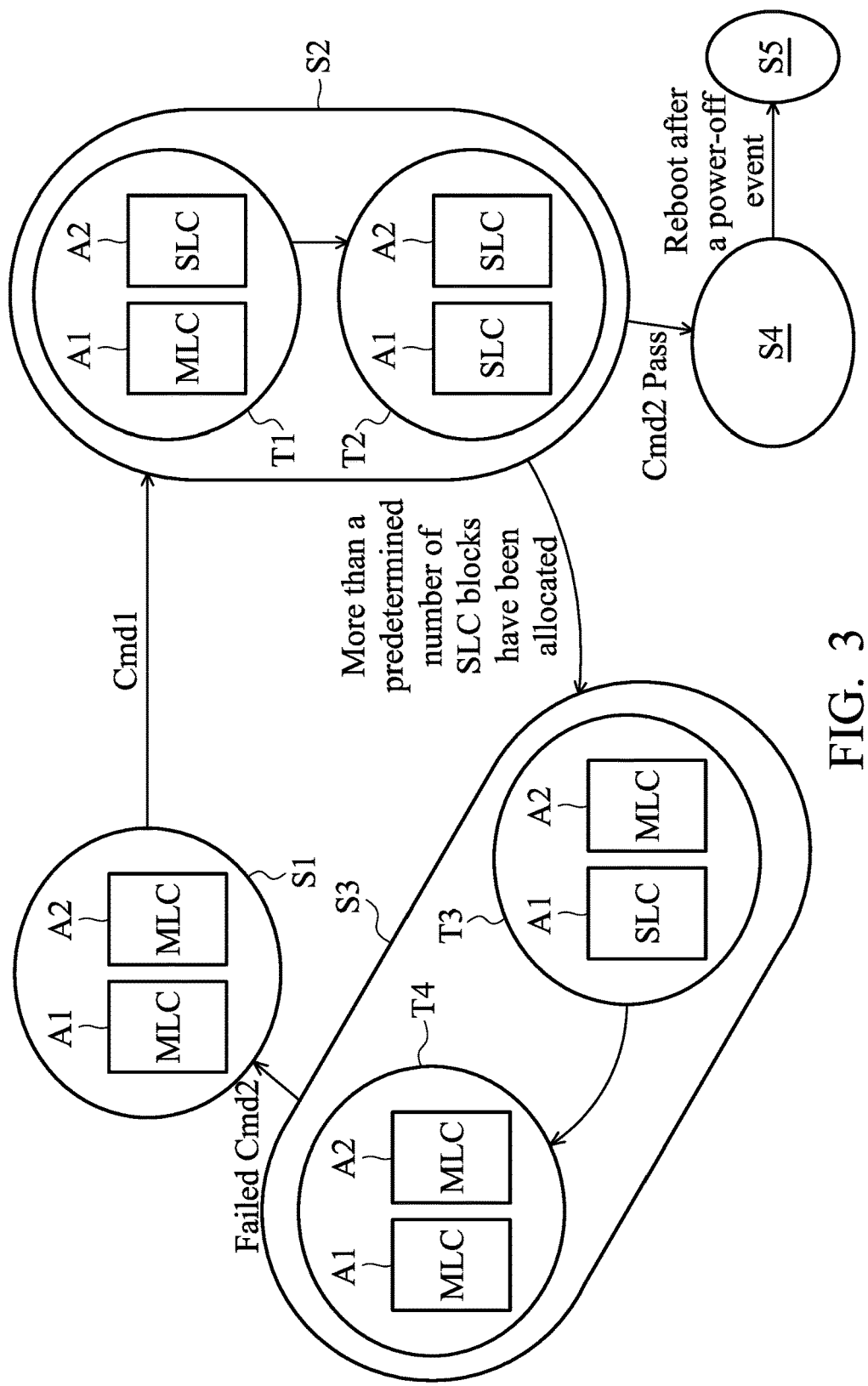
FIG. 3 illustrates how the configuration of the active and alternate active blocks A1 and A2 changes to implement the production state awareness procedure in accordance with an embodiment of the present invention.

FIG. 3 illustrates how the configuration of the active and alternate active blocks A1 and A2 changes to implement the production state awareness (PSA) procedure in accordance with an embodiment of the present invention. In state S1, the production state awareness (PSA) procedure is disabled and the controller 202 allocates MLC blocks as the active block A1 and the alternate active block A2. According to a command Cmd1 issued by the host 206, the controller 202 switches to state S2 to enter the production state awareness (PSA) procedure. In state S2, the controller 202 starts to allocate SLC blocks to store data. As shown, the configuration of the active and alternate active blocks A1 and A2 is changed gradually when the controller 202 enters state S2. At time T1, the newly allocated alternate active block A2 is an SLC block which will be used as an active block A1 at time T2. At time T2, another SLC block is allocated as an alternate active block A2. Thus, it is guaranteed that at time T2 all the received data is stored in the reliable SLCs and therefore a valid part of data-downloading starts. The basic data/code is written to the flash memory 204 when the active block A1 and the alternate active block A2 both are SLC blocks.

In state S2, the number of configurable SLC blocks is limited. When the number of SLC blocks exceeds a predetermined number (for example, the host 206 writes more than 5 GB of data into the flash memory 204), the controller 202 switches to state S3 to allocate MLC blocks to store data. As shown, in state S3, the configuration of the active and alternate active blocks A1 and A2 is changed gradually. At time T3, the newly allocated alternate active block A2 is an MLC block which will be used as an active block A1 at time T4. At time T4, another MLC block is allocated as an alternate active block A2. Thus, at time T2, the controller 202 is switched back to receive data by MLCs.

In an exemplary embodiment, the controller 206 may issue a command Cmd2 to check whether or not the flash memory 204 actually receives data by high-reliability SLCs. According to the command Cmd2, the controller 202 checks the state of itself. When the current active block A1 and alternate active block A2 both are SLC blocks and the controller 202 is in state S2, the success information, about write operations prior to soldering, is returned to the host 206. The checking requested by the command Cmd2 successes. The controller 202 switches to state S4 to show the completion of writing the pre-soldering data into the flash memory 204. The production state awareness (PSA) procedure finishes. It is safe to solder the data storage device 200 onto a printed circuit board of a portable electronic device. The next time the portable electronic device is powered on, the controller 202 is aware of the productized situation (packaged into a portable electronic device) and then enters a product state S5 to operate the flash memory 204 in a consumer mode.

In another case, by executing the received command Cmd2, the controller 202 finds that the active block A1 and the alternate active block A2 are not all SLC blocks (e.g. the controller 202 is in state S3). Because the controller 202 is in state S3, some data is written to the MLCs and may be damaged by the high temperature of soldering. The controller 202 may return a fail message to inform the host 206 of the unreliable write operations prior to soldering. The checking requested by the command Cmd2 fails and the controller 202 switches to state S1. The host 206 may issue a clear command, Unmap, to invalidate the contents of the flash memory 204. The controller 202 that has been switched to state S1 may restart the production state awareness (PSA) procedure according to command Cmd1 that is issued by the host 206 again. The size of the basic data/code may be trimmed at the host 206 side. Thus, the trimmed basic data/code not exceeding the size of the available SLCs can be written to the reliable SLCs in the production state awareness (PSA) procedure. In another exemplary embodiment, the contents of the flash memory 204 are cleared by command Cmd1. The upper limit of SLC blocks to be allocated in state S2 may be also set by the command Cmd1.

Figure 4:
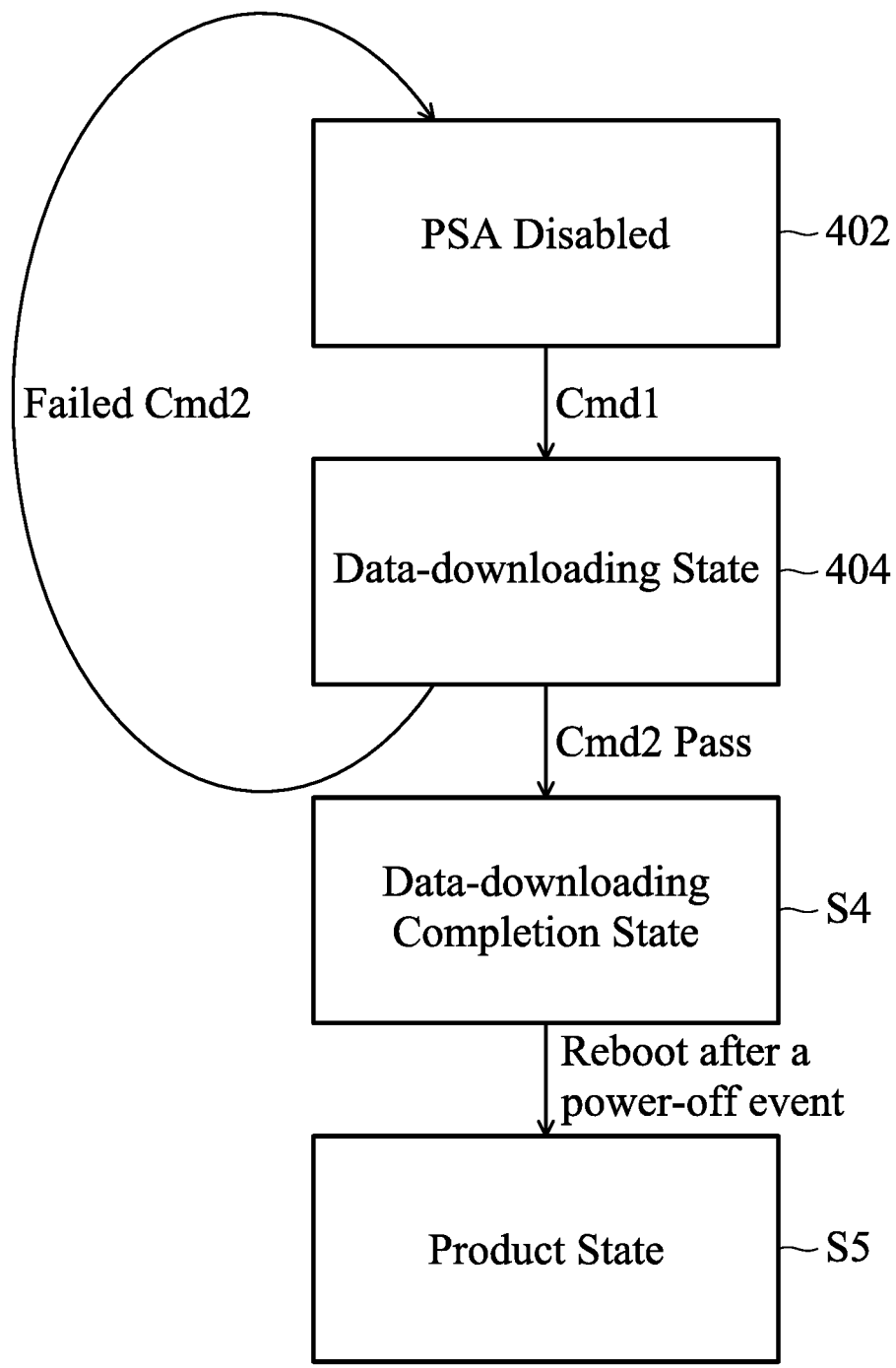
FIG. 4 illustrates a state machine design for the controller 202 in accordance with another exemplary embodiment of the disclosure.

FIG. 4 illustrates a state machine design for the controller 202 in accordance with another exemplary embodiment of the disclosure. Prior to the soldering (for production of a product), the controller 202 may be switched between a PSA-off state 402, a data-downloading state 404 and a data-downloading completion state (i.e. the aforementioned state S4). The PSA-off state 402 may correspond to state S1 of FIG. 3. According to command Cmd1 issued by the host 206, the controller 202 switches from the PSA-off state 402 to the data-downloading state 404. The data-downloading state 404 corresponds to states S2 and S3 of FIG. 3 and the configuration of the allocated blocks may gradually changes as that shown at time points T1 to T4. When the checking triggered by command Cmd2 issued by the host 206 successes, the state machine switches the controller 202 to the state S4. The rebooting after a power-off event will cause the controller 202 to enter the aforementioned product state S5 to operate the flash memory 204 in the consumer mode. On the other hand, when the checking triggered by the command Cmd2 issued by the host 206 fails (i.e. the controller 202 has switched to state S3), the state machine switches the controller 202 to the PSA-off state 402, corresponding to the state switching from state S3 to state S1 shown in FIG. 3.

In an exemplary embodiment, to simplify the requests that the host 206 issues to operate the data storage device 200 (e.g. to reduce the number of commands issued by the host 206), the controller 202 starts from state 404 before being produced as a product (i.e. before the soldering). Thus, prior to the soldering (for production of a product), the data downloaded to the flash memory 204 is written to SLCs. As long as the amount of downloaded data does not exceed the size of the allocated SLC blocks, the contents of the flash memory 204 are surely resistant to soldering. In an exemplary embodiment, 2G data is downloaded while the size of the allocated SLC blocks is 5G.

Figure 5A:
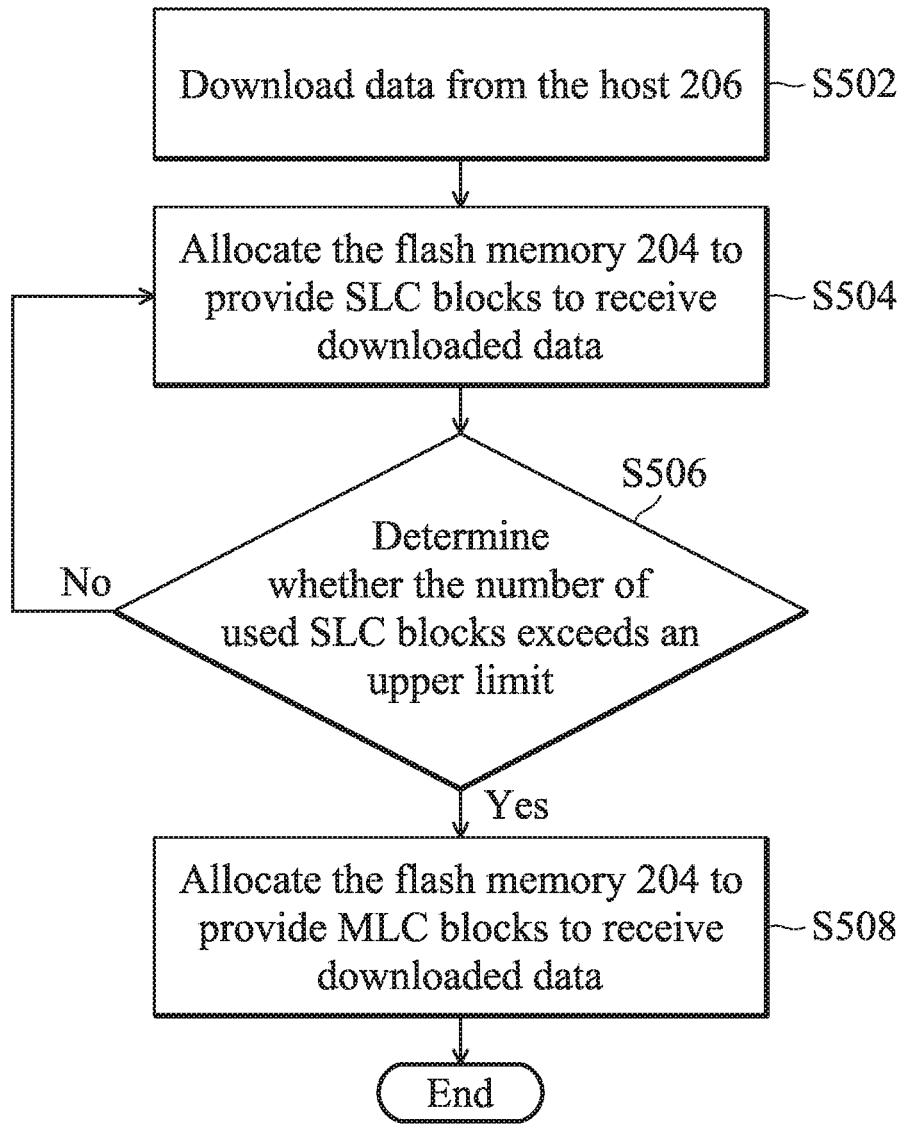
FIG. 5A and FIG. 5B show flowcharts of operating a data storage device.
Figure 5B:
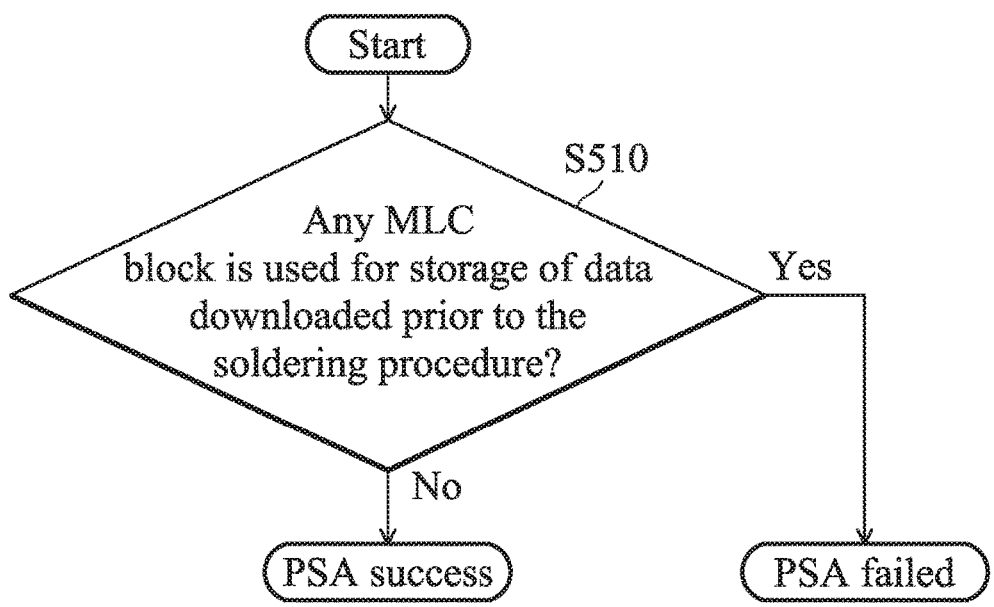

FIG. 5A and FIG. 5B show flowcharts of operating a data storage device. The procedure shows how to operate the flash memory 204 of the data storage device 200 before soldering the package of the data storage device 200 to a printed circuit board. Production state awareness (PSA) is introduced.

Referring to FIG. 5A, in step S502, data is downloaded from the host 206. The controller 202 starts the data-downloading state 404 to allocate the flash memory 204 to provide SLC or MLC blocks to store downloaded data. In step S504, the controller 202 allocates the flash memory 204 to provide SLC blocks to receive downloaded data. According to step S506, the controller 202 determines whether the number of used SLC blocks exceeds an upper limit. If not, step S504 continues to use SLC blocks to receive downloaded data. If yes, step S508 is performed. The controller 202 is switched to allocate the flash memory 204 to provide MLC blocks to receive downloaded data. The flow ends when the downloaded data has been completely written to the flash memory 204. FIG. 5B shows how the PSA works. In step S510, the controller 202 checks whether any MLC block is used for storage of data downloaded prior to the soldering procedure. If yes, PSA shows a fail message. The controller 202 returns to the PSA disabled state 402 and the user may modify the size of the data to be downloaded. Then, the controller 202 restarts the data-downloading state 404 with PSA. If it is determined in step S510 that no MLC block is used for storage of downloaded data, PSA shows a success message. The controller 202 enters the data-downloading completion state S4. After a power-off event and a soldering process, the data storage device 200 is reboot and enters the product state S5.

In other exemplary embodiments, rather than allocating MLC blocks, TLC blocks are allocated in state S3.

Based on the above contents, the present invention further relates to methods for operating a data storage device.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A data storage device, comprising:
a flash memory, providing a plurality of first-type blocks and a plurality of second-type blocks, wherein the first-type blocks comprise single level cells and the second-type blocks comprise multi-level cells; and
a controller, allocating the flash memory to provide the first-type blocks to receive data downloaded from a host before the data storage device is soldered to a printed circuit board, wherein:
when a number of first-type blocks allocated to receive the data downloaded from the host exceeds an upper limit, the controller changes to allocate the flash memory to provide the second-type blocks to receive the data downloaded from the host; and
when detecting that the controller has changed to allocate the flash memory to provide the second-type blocks to receive the data downloaded from the host, the controller returns a fail message to the host to indicate unreliable write operations prior to soldering.

2. The data storage device as claimed in claim 1, wherein:
when data-downloading, from the host to the flash memory prior to the soldering, finishes and the controller does not return the fail message to the host, the controller switches to a product state by a rebooting process after a power-off event to operate the flash memory in a consumer mode.

3. The data storage device as claimed in claim 2, wherein:
according to a checking command issued by a host, the controller checks whether the controller itself has changed to allocate the flash memory to provide the second-type blocks to receive the data downloaded from the host.

4. The data storage device as claimed in claim 3, wherein:
the controller performs the data-downloading, from the host to the flash memory before the soldering, during a production state awareness procedure.

5. The data storage device as claimed in claim 4, wherein:
the controller clears the flash memory before the production state awareness procedure.

6. The data storage device as claimed in claim 5, wherein:
the controller allocates the flash memory to provide an active block and an alternate active block to receive the data downloaded from the host; and
the controller switches to use the alternate active block to receive the data downloaded from the host when finishing using the active block to receive data.

7. The data storage device as claimed in claim 6, wherein:
when the number of first-type blocks allocated to receive the data downloaded from the host exceeds the upper limit, the controller switches to allocate the flash memory to provide the second-type blocks as the alternate active block.

8. The data storage device as claimed in claim 7, wherein:
when returning the fail message to the host, the controller disables the production state awareness procedure.

9. The data storage device as claimed in claim 8, wherein:
according to an enable command for the production state awareness procedure, the controller starts allocating the flash memory to provide the first-type blocks as the alternate active block.

10. The data storage device as claimed in claim 9, wherein:
the controller starts a valid part of the data-downloading when the active block is the first-type block.

11. A method for operating a data storage device, comprising:
allocating a flash memory of a data storage device to provide space to receive data downloaded from a host, wherein the flash memory provides a plurality of first-type blocks and a plurality of second-type blocks, the first-type blocks comprise single level cells, and the second-type blocks comprise multi-level cells; and allocating the flash memory to provide the first-type blocks to receive the data downloaded from the host before the data storage device is soldered to a printed circuit board, wherein:

when a number of first-type blocks allocated to receive the data downloaded from the host exceeds an upper limit, the flash memory is changed to provide the second-type blocks to receive the data downloaded from the host; and when detecting that the flash memory has been changed to provide the second-type blocks to receive the data downloaded from the host, a fail message is returned to the host to indicate unreliable write operations prior to soldering.

12. The method as claimed in claim 11, wherein:

when data-downloading, from the host to the flash memory prior to the soldering, finishes without returning the fail message to the host, a product state is introduced by a rebooting process after a power-off event to operate the flash memory in a consumer mode.

13. The method as claimed in claim 12, wherein:

according to a checking command issued by a host, it is checked whether the flash memory has been changed to provide the second-type blocks to receive the data downloaded from the host.

14. The method as claimed in claim 13, wherein:

the data-downloading, from the host to the flash memory before the soldering, is performed during a production state awareness procedure.

15. The method as claimed in claim 14, further comprising:

clearing the flash memory before the production state awareness procedure.

16. The method as claimed in claim 15, further comprising:

allocating the flash memory to provide an active block and an alternate active block to receive the data downloaded from the host; and switching to use the alternate active block to receive the data downloaded from the host when finishing using the active block to receive data.

17. The method as claimed in claim 16, further comprising:

switching to allocate the flash memory to provide the second-type blocks as the alternate active block when the number of first-type blocks allocated to receive the data downloaded from the host exceeds the upper limit.

18. The method as claimed in claim 17, further comprising:

disabling the production state awareness procedure when the fail message is returned to the host.

19. The method as claimed in claim 18, further comprising:

according to an enable command for the production state awareness procedure, starting to allocate the flash memory to provide the alternate active block from the first-type blocks.

20. The method as claimed in claim 19, further comprising:

starting a valid part of the data-downloading when the active block is the first-type block.

* * * * *